(12) United States Patent
Chae et al.

(10) Patent No.: US 11,515,886 B2
(45) Date of Patent: Nov. 29, 2022

(54) ANALOG-TO-DIGITAL CONVERTER, ELECTRONIC DEVICE INCLUDING THE SAME, AND OPERATING METHOD OF ANALOG-TO-DIGITAL CONVERTER

(71) Applicant: Konkuk University Industrial Cooperation Corp., Seoul (KR)

(72) Inventors: Hyungil Chae, Seoul (KR); Younggyun Oh, Seoul (KR)

(73) Assignee: Konkuk University Industrial Cooperation Corp., Seoul (KR)

( * ) Notice: Subject to any disclaimer, the term of this patent is extended or adjusted under 35 U.S.C. 154(b) by 0 days.

(21) Appl. No.: 17/382,866

(22) Filed: Jul. 22, 2021

(65) Prior Publication Data

US 2022/0077869 A1     Mar. 10, 2022

(30) Foreign Application Priority Data

Sep. 7, 2020   (KR) .................. 10-2020-0113629
May 24, 2021   (KR) .................. 10-2021-0066440

(51) Int. Cl.
   *H03M 1/12*       (2006.01)
   *H03M 1/46*       (2006.01)
(52) U.S. Cl.
   CPC ......... *H03M 1/462* (2013.01); *H03M 1/1215* (2013.01); *H03M 1/1225* (2013.01); *H03M 1/1245* (2013.01)
(58) Field of Classification Search
   CPC .. H03M 1/462; H03M 1/1215; H03M 1/1225; H03M 1/1245

(Continued)

(56) References Cited

U.S. PATENT DOCUMENTS

| 10,171,102 B1 | 1/2019 | Shibata et al. |
| 2005/0280572 A1* | 12/2005 | Shima ............ H04B 7/0606 342/158 |
| 2015/0363359 A1* | 12/2015 | Marr ............... G06F 17/142 708/300 |

FOREIGN PATENT DOCUMENTS

KR       101435978 B1       9/2014

OTHER PUBLICATIONS

Gabriele Manganaro et al., Interleaving ADCs: Unraveling the Mysteries, https://www.analog.com/en/analog dialogue/articles/interleaving adcs.html.

(Continued)

*Primary Examiner* — Peguy Jean Pierre
(74) *Attorney, Agent, or Firm* — Harness, Dickey & Pierce, P.L.C.

(57) ABSTRACT

Disclosed are an analog-to-digital converter (ADC), an electronic device including the ADC, and an operating method of the ADC. The ADC includes a first stage that includes a plurality of channels, generates a first sampling signal by sequentially sampling a first analog signal based on time interleaving, and generates a first digital signal and a first residual signal corresponding to the first analog signal by performing analog-to-digital conversion based on the first sampling signal, an amplifier that amplifies the first residual signal, and a second stage that includes a plurality of channels, generates a second sampling signal by sequentially sampling the amplified first residual signal based on time interleaving, and generates a second digital signal and a second residual signal corresponding to the first analog signal by performing analog-to-digital conversion based on the second sampling signal. The number of the plurality of channels included in the first stage is odd-numbered.

20 Claims, 9 Drawing Sheets

(58) Field of Classification Search
USPC .................................................. 341/161, 155
See application file for complete search history.

(56) References Cited

OTHER PUBLICATIONS

S. Oh, K. Kim and H. Chae, "Bandpass ΔΣ ADC using pipelined SAR ADC," in Electronics Letters, vol. 56, No. 10, pp. 480 482, May 14, 2020, doi: 10.1049/el.2020.0314.
V. Sarma, N. A. Jacob, B. D. Sahoo, V. Narayanaswamy and V. Choudhary, "A 250 MHz Pipelined ADC Based $f_s/4$ Noise Shaping Bandpass ADC," in IEEE Transactions on Circuits and Systems I: Regular Papers, vol. 65, No. 6, pp. 1785 1794, Jun. 2018, doi: 10.1109/TCSI.2017.2766883.
L. Jie, B. Zheng and M. P. Flynn, "A Calibration Free Time Interleaved Fourth Order Noise Shaping SAR ADC," in IEEE Journal of Solid State Circuits, vol. 54, No. 12, pp. 3386 3395, Dec. 2019, doi: 10.1109/JSSC.2019.2938626.

\* cited by examiner

ANALOG-TO-DIGITAL CONVERTER, ELECTRONIC DEVICE INCLUDING THE SAME, AND OPERATING METHOD OF ANALOG-TO-DIGITAL CONVERTER

CROSS-REFERENCE TO RELATED APPLICATIONS

This application claims priority under 35 U.S.C. § 119 to Korean Patent Application Nos. 10-2020-0113629 filed on Sep. 7, 2020 and 10-2021-0066440 filed on May 24, 2021, in the Korean Intellectual Property Office, the disclosures of which are incorporated by reference herein in their entireties.

BACKGROUND

Embodiments of the present disclosure described herein relate to a time interleaving pipelined bandpass noise shaping successive approximation register (SAR) analog-to-digital converter, an electronic device including the analog-to-digital converter, and an operating method of the analog-to-digital converter.

An analog to digital converter (ADC) may convert an analog signal expressed by continuous values into a digital signal (e.g., a string of an integer number of bits) expressed by discrete values. The ADC may include a delta-sigma ADC, a successive approximation register (SAR) ADC, etc. To secure a high resolution and a fast operating speed, a time interleaving ADC including a plurality of ADC channels connected in parallel, a pipelined ADC including ADC stages connected in series, etc. are being used.

To implement a resonator with a high Q-factor, a bandpass ADC may include a plurality of operational transconductance amplifiers (OTAs) or one OTA consuming a lot of power. As such, the level of difficulty of implementation of the ADC may increase, the area occupied by the ADC may increase, and power consumption of the ADC may increase.

SUMMARY

Embodiments of the present disclosure provide an analog-to-digital converter, an electronic device including the analog-to-digital converter, and an operating method of the analog-to-digital converter.

According to an embodiment, an analog-to-digital converter may include a first stage that includes a plurality of channels, generates a first sampling signal by sequentially sampling a first analog signal based on time interleaving, and generates a first digital signal and a first residual signal corresponding to the first analog signal by performing analog-to-digital conversion based on the first sampling signal, an amplifier that amplifies the first residual signal, and a second stage that includes a plurality of channels, generates a second sampling signal by sequentially sampling the amplified first residual signal based on time interleaving, and generates a second digital signal and a second residual signal corresponding to the first analog signal by performing analog-to-digital conversion based on the second sampling signal, and the number of the plurality of channels included in the first stage may be odd-numbered.

According to an embodiment, an electronic device may include a processor, and a communication device that includes an analog-to-digital converter and communicates with an external device under control of the processor. The analog-to-digital converter may include a first stage that includes a plurality of channels, generates a first sampling signal by sequentially sampling a first analog signal based on time interleaving, and generates a first digital signal and a first residual signal corresponding to the first analog signal by performing analog-to-digital conversion based on the first sampling signal, an amplifier that amplifies the first residual signal, and a second stage that includes a plurality of channels, generates a second sampling signal by sequentially sampling the amplified first residual signal based on time interleaving, and generates a second digital signal and a second residual signal corresponding to the first analog signal by performing analog-to-digital conversion based on the second sampling signal. The number of the plurality of channels of the first stage may be odd-numbered, and the number of the plurality of channels of the second stage may be even-numbered.

According to an embodiment, an operating method of an analog-to-digital converter which includes a first stage and a second stage each including a plurality of channels, and an inter-stage amplifier may include generating, by the first stage, a first sampling signal by sequentially sampling a first analog signal based on time interleaving, generating, by the first stage, a first digital signal and a first residual signal corresponding to the first analog signal by sequentially performing analog-to-digital conversion based on the first sampling signal, amplifying, by the inter-stage amplifier, the first residual signal, generating, by the second stage, a second sampling signal by sequentially sampling the amplified first residual signal based on time interleaving, and generating, by the second stage, a second digital signal and a second residual signal corresponding to the first analog signal by performing analog-to-digital conversion based on the second sampling signal, and the number of the plurality of channels of the first stage may be odd-numbered, and the number of the plurality of channels of the second stage may be even-numbered.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure.

Hereinafter, embodiments of the present disclosure will be described in more detail with reference to accompanying drawings. In describing the present disclosure, to make the overall understanding easy, like components/elements will be marked by like reference signs/numerals in drawings, and thus, additional description will be omitted to avoid redundancy.

Figure 1:
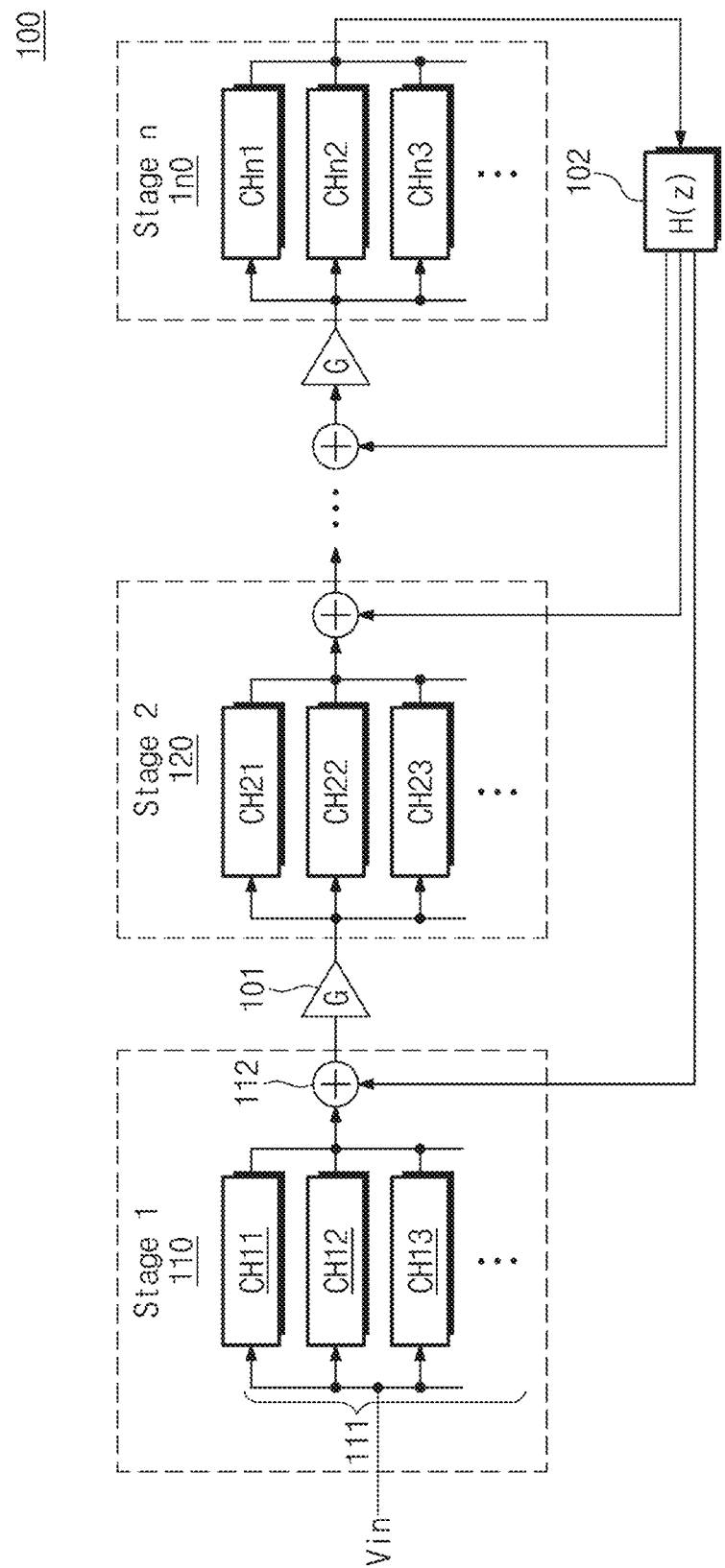
FIG. 1 is a block diagram of an analog-to-digital converter (ADC) according to some embodiments of the present disclosure.

FIG. 1 is a block diagram of an analog-to-digital converter (ADC) 100 according to some embodiments of the present disclosure. Referring to FIG. 1, the ADC 100 may include a plurality of stages 110 to 1n0 (n being a natural number) connected in series, an inter-stage amplifier (e.g., 101), and a loop filter 102. An input signal Vin being an analog signal may be converted into a digital signal through the plurality of stages 110 to 1n0. For convenience of illustration, an example in which each of the plurality of stages 110 to 1n0 includes a plurality of channels and an adder is illustrated, but the present disclosure is not limited thereto. For example, each of the plurality of stages 110 to 1n0 may further include a block that performs a sampling and hold operation.

In some embodiments, the ADC 100 may be implemented as an ADC in which a pipelined structure and a time interleaving structure are combined. For example, the ADC 100 may be implemented as a pipelined structure including the plurality of stages 110 to 1n0, and each of the plurality of stages 110 to 1n0 may be implemented as a time interleaving structure including a plurality of channels connected in parallel. Each of the plurality of channels may include one or more ADCs that are implemented substantially identically and operate substantially identically. The plurality of stages may perform analog-to-digital conversion sequentially from the most significant bit to the least significant bit. Each of the plurality of channels may convert an analog signal to a digital signal, and the analog-to-digital conversion of the plurality of channels may be performed sequentially (e.g., in a time interleaving manner).

For example, in the embodiment illustrated in FIG. 1, each of the plurality of stages 110 to 1n0 may include one or more channels. The first stage 110 may include a plurality of channels 111 connected in parallel and an adder 112. The plurality of channels 111 may be implemented substantially identically. For example, each of the plurality of channels 111 may include one or more ADCs of substantially the same performance. In some embodiments, each of the plurality of channels 111 may include one or more successive approximation register (SAR) ADCs. As such, the ADC 100 may operate at low power.

Each of the plurality of channels 111 may convert an analog signal to a digital signal based on time interleaving. For example, during a first time, a first channel CH11 of the first stage 110 may convert the input signal Vin into a digital signal and may transmit a residual signal (or a residual voltage, an error signal, or an error voltage) to the adder 112. The residual signal may be a signal corresponding to a difference between the analog signal, which remains after converting the input signal Vin into the digital signal, and the digital signal. Afterwards, during a second time, a second channel CH12 of the first stage 110 may convert the input signal Vin into a digital signal and may transmit a residual signal to the adder 112. Afterwards, during a third time, a third channel CH13 of the first stage 110 may convert the input signal Vin into a digital signal and may transmit a residual signal to the adder 112.

The adder 112 may perform an addition operation (or a subtraction operation) on a filtered signal from the loop filter 102 and the residual signal received from any one of the plurality of channels 111. As such, noise shaping may be performed on the residual signal that is transferred from the first stage 110 to the second stage 120. For example, a quantization noise of the residual signal in a specific frequency band may be reduced. The adder 112 may transfer an operation result to the amplifier 101.

The amplifier 101 may amplify the residual signal transferred from the first stage 110 so as to be transferred to the second stage 120. As in the first stage 110, the second stage 120 may convert an analog signal from the amplifier 101 into a digital signal based on the time interleaving and may transfer a residual signal to a third stage (not illustrated). For example, the first stage 110 may perform analog-to-digital conversion on the most significant bit (MSB), and the second stage 120 may perform analog-to-digital conversion the next less significant bit (or one of the next most significant bits).

As in the first stage 110, the n-th stage 1n0 may convert an analog signal transferred from an (n−1)-th stage (not illustrated) through an inter-channel amplifier into a digital signal based on the time interleaving. The n-th stage 1n0 may transfer a residual signal to the loop filter 102.

The loop filter 102 may filter the residual signal generated from the n-th stage 1n0. A first frequency band component of the residual signal generated from the n-th stage 1n0 may be filtered (or reduced) through the loop filter 102. For example, the loop filter 102 may reduce a quantization noise of a desired frequency band of a residual signal. The loop filter 102 may transfer the filtered signal to the adders (e.g., 112) of the plurality of stages 110 to 1n0. As such, an analog signal in which a quantization noise of a specific frequency band is reduced may be fed back to the plurality of stages 110 to 1n0.

In some embodiments, the loop filter 102 may be implemented as a low pass filter. In some embodiments, a high-frequency component of a residual signal may be filtered by the loop filter 102. For example, a high-frequency quantization noise of a residual signal may be reduced by the loop filter 102. The filtered residual signal may be transferred to the adders (e.g., 112) of the plurality of stages 110 to 1n0. As the residual signal in which a high-frequency component is filtered is fed back to the plurality of stages 110 to 1n0, a quantization noise in an in-band may be reduced. For example, the ADC 100 may reduce a quantization noise of a specific frequency band. As a result, the ADC 100 may operate as a bandpass ADC.

Figure 2:
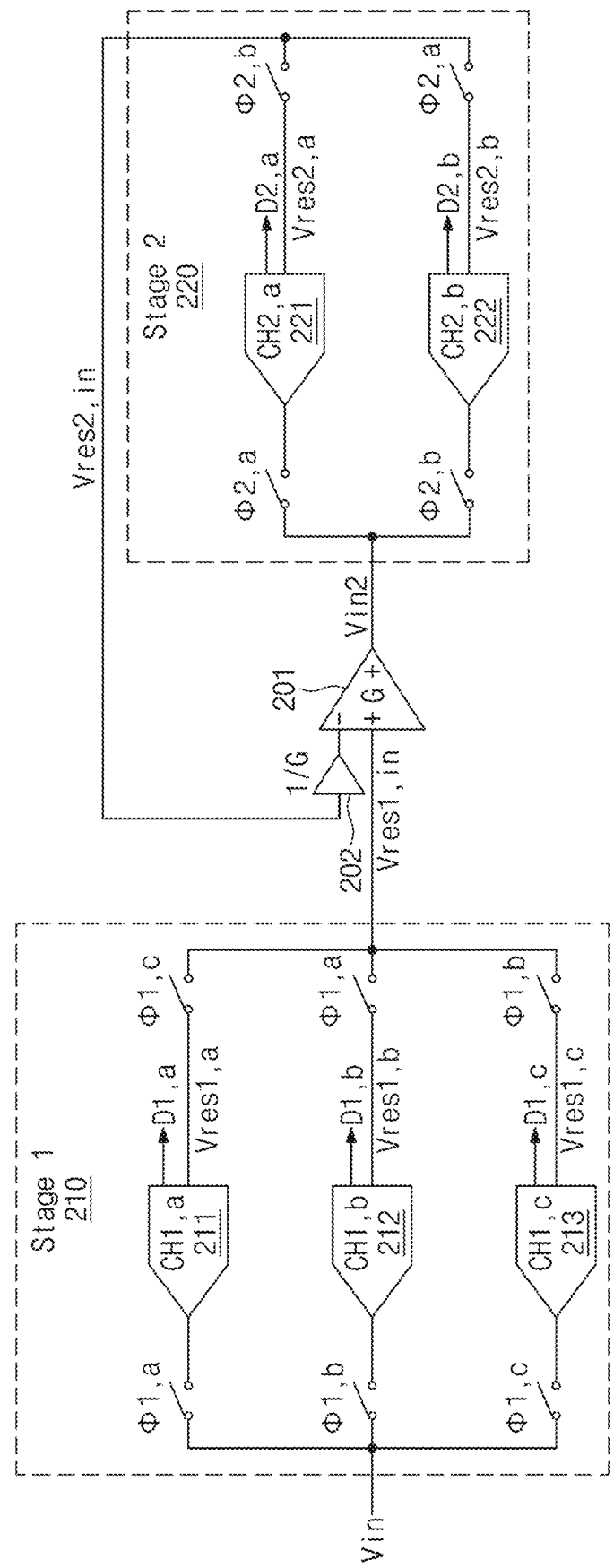
FIG. 2 is a block diagram of an ADC according to some embodiments of the present disclosure.

FIG. 2 is a block diagram of an ADC 200 according to some embodiments of the present disclosure. Referring to FIG. 2, the ADC 200 may include a first stage 210, a second stage 220, and amplifiers 201 and 202. The ADC 200 may include two stages 210 and 220, and each of the stages 210 and 220 may be implemented as a pipelined time interleaving ADC including two or more channels. As such, there may be provided an ADC that is capable of being simply implemented and provides a wide bandwidth with high resolution while operating at high speed. In some embodiments, each of channels 211, 212, 213, 221, and 222 may include one or more SAR ADCs. As such, the ADC 200 may operate at low power.

In some embodiments, the first stage 210 may include an odd number of channels, and the second stage 220 may include an even number of channels. For example, in the embodiment illustrated in FIG. 2, the first stage 210 may include three channels 211, 212, and 213, and the second stage 220 may include two channels 221 and 222. However, the present disclosure is not limited thereto. As the first stage 210 includes an odd number of channels, the occurrence of interleaving spur in the in-band may be prevented. The occurrence of interleaving spur will be more fully described with reference to FIGS. 6A and 6B.

The first stage 210 may include three channels 211, 212, and 213. The channels 211, 212, and 213 may sequentially convert the input signal Vin into a digital signal. For example, the input signal Vin may be sampled and converted into a digital signal by the channel 211, may then be sampled and converted into a digital signal by the channel 212, and may then be sampled and converted into a digital signal by the channel 213. Afterwards, the input signal Vin may be again sampled and converted into a digital signal by the channel 211.

For example, during a first time period (e.g., from a first time ($\Phi1,a$) to a second time ($\Phi1,b$)), the input signal Vin may be sampled by the channel 211. During a second time period (e.g., from the second time ($\Phi1,b$) to a third time ($\Phi1,c$)), the channel 211 may output a digital signal (D1,$a$) by performing analog-to-digital conversion on the sampled input signal Vin. During a third time period (e.g., from the third time ($\Phi1,c$) to a fourth time), the channel 211 may transfer a residual signal (Vres1,$a$) to the amplifier 201 as a residual signal (Vres1,in), and the amplifier 201 may amplify the residual signal (Vres1,in).

While the input signal Vin is converted into a digital signal by the channel 211 (e.g., during the second time period), the input signal Vin may be sampled by the channel 212. Afterwards, during the third time period, the channel 212 may output a digital signal (D1,$b$) by performing analog-to-digital conversion on the input signal Vin. During the fourth time period following the third time period, the channel 212 may transfer a residual signal (Vres1,$b$) to the amplifier 201 as the residual signal (Vres1,in), and the amplifier 201 may amplify the residual signal (Vres1,in).

While the input signal Vin is converted into a digital signal by the channel 212 (e.g., during the third time period), the input signal Vin may be sampled by the channel 213. Afterwards, during the fourth time period, the channel 213 may output a digital signal ($\Phi1,c$) by performing analog-to-digital conversion on the input signal Vin. During a fifth time period following the fourth time period, the channel 213 may transfer a residual signal (Vres1,$c$) to the amplifier 201 as the residual signal (Vres1,in), and the amplifier 201 may amplify the residual signal (Vres1,in).

While the input signal Vin is converted into a digital signal by the channel 213 (e.g., during the fourth time period), the input signal Vin may be sampled. Afterwards, during the fifth time period, the channel 211 may perform analog-to-digital conversion on the sampled input signal Vin. The channels 211, 212, and 213 of the first stage 210 may alternately sample the input signal Vin so as to be converted into a digital signal.

The amplifier 201 may include a first input terminal of receiving the residual signal (Vres1,in) generated from the first stage 210 and a second input terminal connected to an output terminal of the amplifier 202. The amplifier 201 may amplify the residual signal (Vres1,in) and an output signal of the amplifier 202. The amplifier 201 may provide the amplified signal to the second stage 220 as an input signal Vin2.

The amplifier 202 may include an input terminal of receiving a residual signal (Vres2,in) generated from the second stage 220 and an output terminal connected to the second input terminal of the amplifier 201. The amplifier 202 may amplify a magnitude of the residual signal (Vres2,in) as much as "1/G" times. For example, the amplifier 202 may decrease the magnitude of the residual signal (Vres2,in) and may provide a signal of the decreased magnitude to the amplifier 201.

The second stage 220 may include the channels 221 and 222. As in the first stage 210, the channels 221 and 222 may sequentially convert the input signal Vin2 into a digital signal.

For example, during a sixth time period (e.g., from a first time ($\Phi2,a$) to a second time ($\Phi2,b$)), the input signal Vin2 output from the amplifier 201 may be sampled. During a seventh time period following the sixth time period, the channel 221 may output a digital signal (D2,$a$) by performing analog-to-digital conversion on the sampled input signal Vin2. The channel 221 may transfer a residual signal (Vres2,$a$) to the amplifier 202 as the residual signal (Vres2,in), and the amplifier 202 may amplify the residual signal (Vres2,in) as much as "1/G" times.

While the input signal Vin2 is converted into a digital signal by the channel 221 (e.g., during the seventh time period), the input signal Vin2 may be sampled by the channel 222. Afterwards, during an eighth time period following the seventh time period, the channel 222 may output a digital signal (D2,$b$) by performing analog-to-digital conversion on the sampled input signal Vin2. The channel 222 may transfer a residual signal (Vres2,$b$) to the amplifier 202 as the residual signal (Vres2,in), and the amplifier 202 may amplify the residual signal (Vres2,in) as much as "1/G" times.

During the eighth time period, the channel 221 may sample the input signal Vin2. Afterwards, during a ninth time period following the eighth time period, the channel 221 may perform analog-to-digital conversion on the sample input signal Vin2. As a result, the channels 221 and 222 of the second stage 220 may alternately sample the input signal Vin2 so as to be converted into a digital signal.

The residual signal (Vres2,in) output from the second stage 220 may be fed back to the second stage 220 through the amplifier 202 and the amplifier 201. As such, noise shaping may be performed. For example, a quantization noise of the input signal Vin2 in the in-band of the ADC 200 may be reduced. As such, the ADC 200 may operate as a bandpass ADC.

Figure 3:
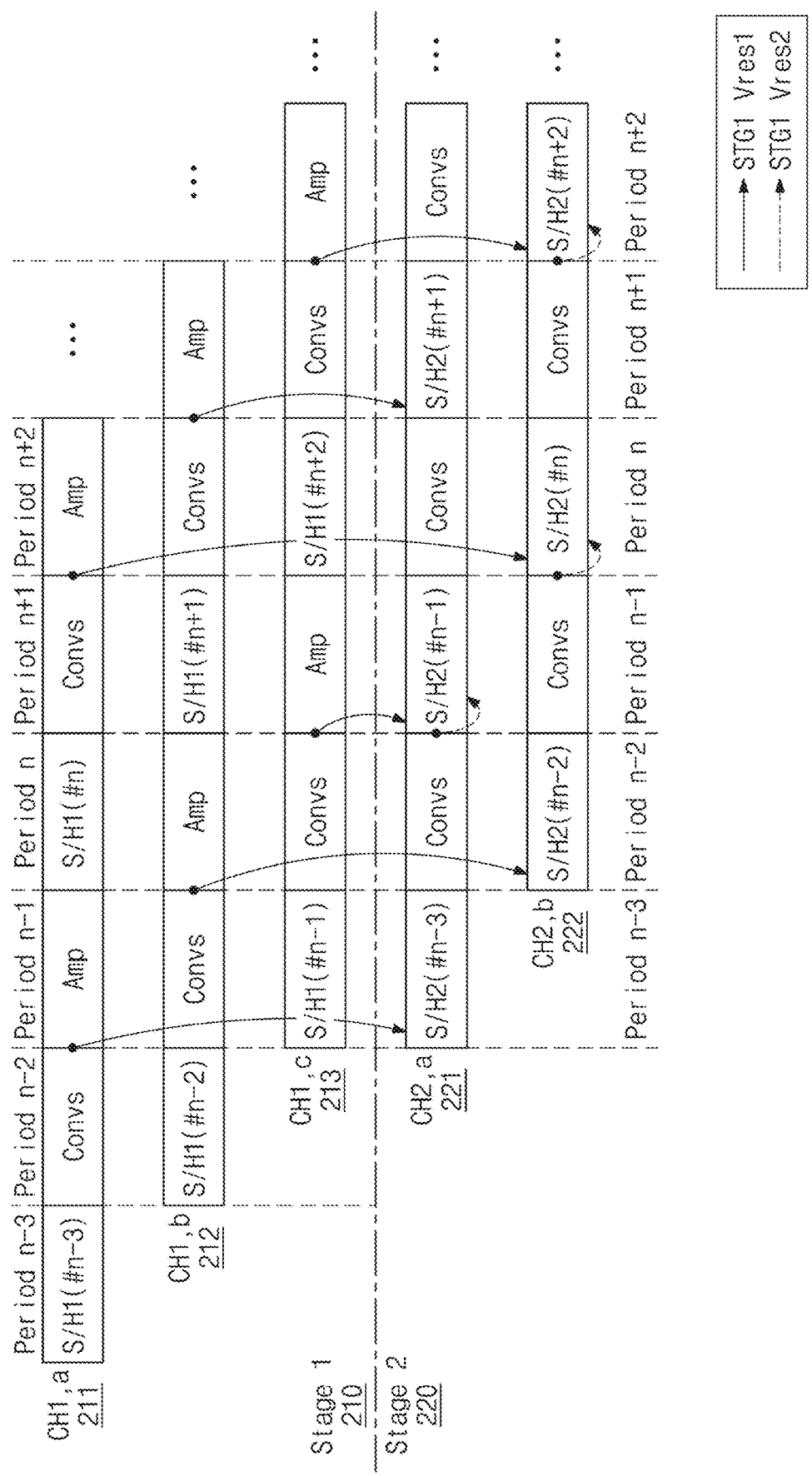
FIG. 3 is a timing diagram illustrating an operation of an ADC of FIG. 2, according to some embodiments of the present disclosure.

FIG. 3 is a timing diagram illustrating an operation of the ADC 200 of FIG. 2, according to some embodiments of the present disclosure. An operation of the ADC 200 will be more fully described with reference to FIGS. 2 and 3.

The channels 211, 212, and 213 of the first stage 210 may generate a sampling signal by sequentially sampling the input signal Vin being an analog signal based on the time interleaving (in the embodiment illustrated in FIG. 3, corresponding to "S/H1"). For example, the channels 211, 212, and 213 of the first stage 210 may sequentially perform a sample and hold operation on the input signal Vin.

The channels 211, 212, and 213 of the first stage 210 may sequentially perform sampling on the input signal Vin, based on a given sampling period. In the embodiment illustrated in FIG. 3, sampling periods may be classified over time and may be referred to as, for example, an "(n−3)-th period", an "(n−2)-th period", an "(n−1)-th period", an "n-th period", an "(n+1)-th period", an "(n+2)-th period", etc.

Each of the channels 211, 212, and 213 of the first stage 210 may perform digital conversion based on the generated sampling signal (in the embodiment illustrated in FIG. 3, corresponding to "Convs"). For example, the channels 211, 212, and 213 of the first stage 210 may perform digital conversion on the most significant bit (MSB). The channels 211, 212, and 213 of the first stage 210 may respectively output the digital signals (D1,a), (D1,b), and (D1,c) and the residual signals (Vres1,a), (Vres1,b), and (Vres1,c), which correspond to the most significant bit.

The residual signals (Vres1,a), (Vres1,b), and (Vres1,c) may be alternately amplified (in the embodiment illustrated in FIG. 3, corresponding to "Amp"). For example, the residual signals (Vres1,a), (Vres1,b), and (Vres1,c) may be alternately amplified by the inter-stage amplifier 201 based on a given period. In some embodiments, the given period may correspond to the sampling period described above.

In the embodiment illustrated in FIG. 3, in the (n−3)-th period of the first stage 210, the channel 211 of the first stage 210 may perform sampling on the input signal Vin ("S/H1 (#n−3)"). While digital conversion is performed by the channel 211 ("Convs"), in the (n−2)-th period, the channel 212 may perform sampling on the input signal Vin ("S/H1 (#n−2)"). While the residual signal generated by the channel 211 is amplified ("Amp"), that is, in the (n−1)-th period, the channel 212 may perform digital conversion ("Convs"), and the channel 213 may perform sampling on the input signal Vin ("S/H1(#n−1)"). As in the above manner, the channel 211 may again perform sampling on the input signal Vin in the n-th period. In other words, the channels may alternately sample the input signal Vin, may alternately perform digital conversion on the sampled analog signals, and may alternately amplify residual signals.

The residual signal (Vres1,a)/(Vres1,b)/(Vres1,c) generated from the first stage 210 may be transferred to the second stage 220. For example, the channel 211 of the first stage 210 may perform digital conversion based on the sampled signal and may then transfer the residual signal (Vres1,a) to the second stage 220.

The channels 221 and 222 of the second stage 220 may generate a sampling signal by sequentially sampling the residual signal (Vres1,a)/(Vres1,b)/(Vres1,c), which is output from the first stage 210 and is an analog signal, based on the time interleaving ("S/H2"). For example, the channels 211, 212, and 213 of the first stage 210 may sequentially perform a sample and hold operation on the input signal Vin.

The channels 221 and 222 of the second stage 220 may perform sampling on residual signals Vres1 (e.g., (Vres1,a), (Vres1,b), and (Vres1,c)) sequentially output from the first stage 210, based on a given sampling period (in the embodiment illustrated in FIG. 3, corresponding to "S/H2"). In the embodiment illustrated in FIG. 3, sampling periods may be classified over time and may be referred to as, for example, an "(n−3)-th period", an "(n−2)-th period", an "(n−1)-th period", an "n-th period", an "(n+1)-th period", an "(n+2)-th period", etc.

In some embodiments, an amplification operation "Amp" in the first stage 210 and a sampling operation "S/H2" in the second stage 220 may be synchronized. For example, the amplification operation of the residual signal Vres1 output from the first stage 210 and the sampling operation for the amplified residual signal Vres1 may be performed substantially simultaneously. In the embodiment illustrated in FIG. 3, an arrow "STG Vres1" from the first stage 210 to the second stage 220 may indicate that the residual signal Vres1 is amplified by the inter-stage amplifier 201 and is transferred to and sampled by one of the channels 221 and 222 of the second stage 220. The channels 211, 212, and 213 of the first stage 210 may alternately transfer the amplified residual signal Vres1 to one of the channels 221 and 222 of the second stage 220 based on the given period (e.g., the sampling period).

Each of the channels 221 and 222 of the second stage 220 may perform digital conversion based on the generated sampling signal (in the embodiment illustrated in FIG. 3, corresponding to "Convs"). For example, the channels 221 and 222 of the second stage 220 may perform digital conversion on the least significant bit (LSB). The channels 221 and 222 of the second stage 220 may respectively output the digital signals (D2,a) and (D2,b), which correspond to the least significant bit, and the residual signals (Vres2,a) and (Vres2,b). Unlike the channels 211, 212, and 213 of the first stage 210, the channels 221 and 222 of the second stage 220 may not perform an amplification operation (e.g., an operation corresponding to "Amp").

In the embodiment illustrated in FIG. 3, in the (n−3)-th period of the second stage 220, the channel 221 of the second stage 220 may perform sampling on the residual signal (Vres1,a) ("S/H2(#n−3)"). While digital conversion is performed by the channel 221 ("Convs"), in the (n−2)-th period, the channel 222 may perform sampling on the residual signal (Vres1,b) output from the channel 212 of the first stage 210 ("S/H2(#n−2)"). After perform digital conversion, the channel 221 may again provide the residual signal (Vres2,a) to the channel 221. For example, the residual signal (Vres2,a) may again be provided to the channel 221 through the amplifier 201. While digital conversion is performed by the channel 222 ("Convs"), in the (n−1)-th period, the channel 221 may perform sampling based on the residual signal (Vres1,c) output from the channel 213 of the first stage 210 and the residual signal (Vres2,a) generated from the channel 221 ("S/H2(#n−1)").

In some embodiments, the residual signal (Vres2,a) output from the channel 221 of the second stage 220 may be delayed during a given period and may then be provided to the channel 221. For example, in the (n−1)-th period, the residual signal (Vres2,a) may be applied to a sample and hold operation of the channel 221 ("S/H2(#n−1)"). Afterwards, after two sampling periods, that is, in the (n+1)-th period, the residual signal (Vres2,a) may again be applied to the sample and hold operation of the channel 221 ("S/H2(#n+1)"). As such, an error caused by the LSB conversion performed by the channel 221 may again be fed back to the channel 221, and an intermediate frequency IF of the ADC 200 may satisfy Equation 1 below with respect to the sampling rate Fs.

$$IF = Fs/4 \qquad \text{[Equation 1]}$$

In other words, the intermediate frequency IF may be ¼ times the sampling rate Fs. As a result, the ADC 200 may be implemented as a bandpass noise shaping ADC.

Figure 4:
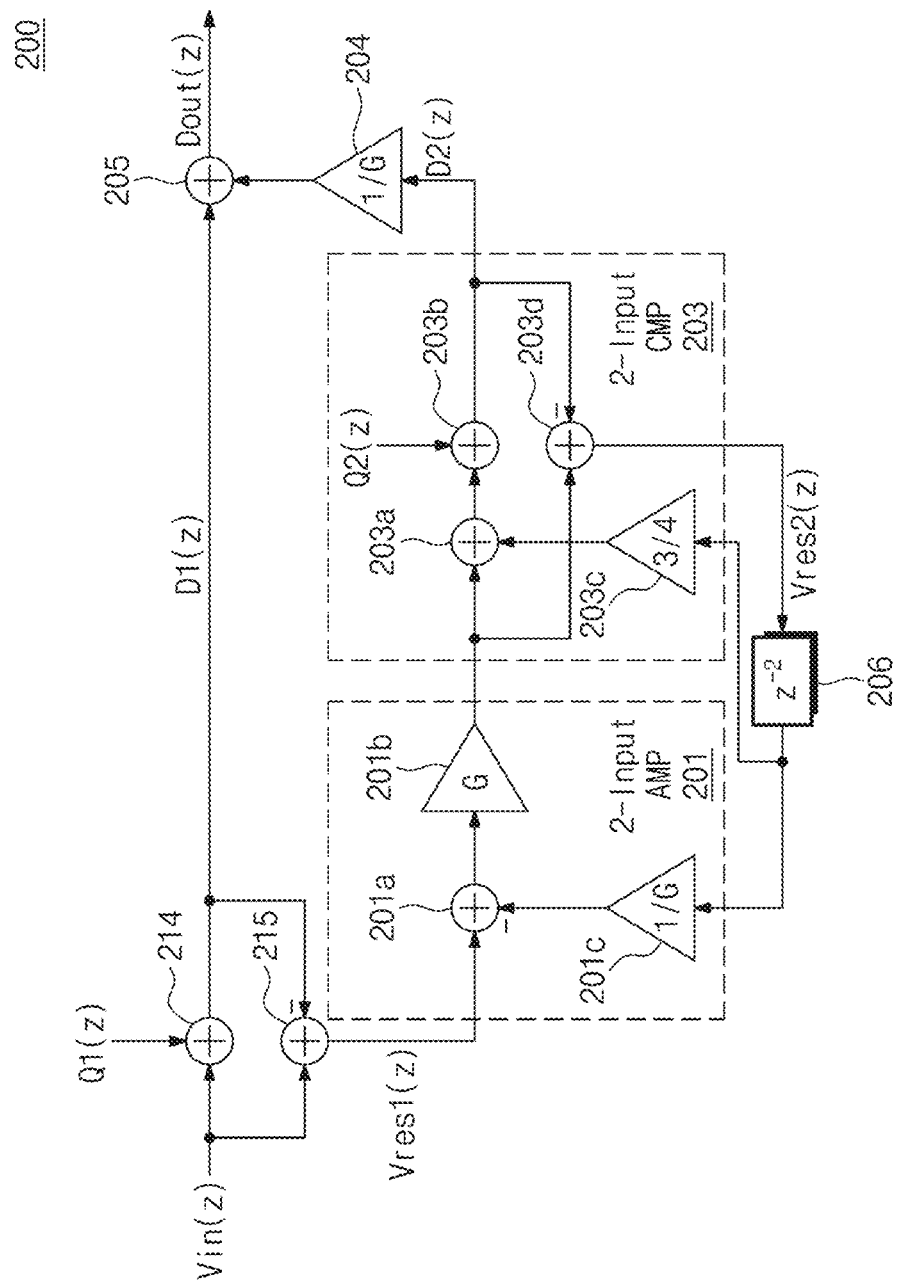
FIG. 4 is a block diagram of an ADC according to some embodiments of the present disclosure.

FIG. 4 is a block diagram of the ADC 200 according to some embodiments of the present disclosure. Referring to FIGS. 2 to 4, the ADC 200 may further include a comparator 203, an amplifier 204, adders 205 and 214, a subtracter 215, and a block 206. For convenience of description, some components, which perform a sampling operation and an analog-to-digital conversion operation, from among some components (e.g., an SAR ADC or the channels 211 to 213, 221, and 222) of the ADC 200 are omitted.

In some embodiments, the adder 214 and the subtracter 215 may be included in the first stage 210. For example, each of the channels 211 to 213 of the first stage 210 may include an adder corresponding to the adder 214 and a subtracter corresponding to the subtracter 215. For another example, the channels 211 to 213 of the first stage 210 may sequentially (or alternately) share the adder 214 and the subtracter 215.

An input signal Vin(z) may be converted into a digital signal D1(z) by the first stage 210. For example, the input signal Vin(z) may correspond to the input signal Vin of FIG. 2. The adder 214 may calculate a sum of the input signal Vin(z) and a quantization noise Q1(z) generated by the first stage 210. The quantization noise Q1(z) may be generated from analog-to-digital conversion that is performed in the first stage 210. The adder 214 may output the calculated sum as the digital signal D1(z). The digital signal D1(z) may be one of the digital signals (D1,a) to (D1,c). For example, when analog-to-digital conversion is performed by the channel 211, the adder 214 may calculate a sum of the input signal Vin applied to the channel 211 and a quantization noise generated by the channel 211 and may output the calculated sum as the digital signal (D1,a).

The subtracter 215 may calculate a difference between the input signal Vin(z) and a calculation result of the adder 214. A calculation result of the subtracter 215 may be provided to the amplifier 201 as a residual signal Vres1(z). The residual signal Vres1(z) may be one of the residual signals (Vres1,a) to (Vres1,c). For example, when analog-to-digital conversion is performed by the channel 211, the subtracter 215 may calculate a difference between the input signal Vin applied to the channel 211 and the digital signal (D1,a) and may transfer the calculated difference to the amplifier 201 as the residual signal (Vres1,a).

The amplifier 201 may include subtracter 201a and amplifiers 201b and 201c. The amplifier 201 may include two input terminals ("2-Input AMP"). The amplifier 201 may simultaneously amplify the residual signal Vres1(z) output from the first stage 210 and a twice delayed residual signal Vres2(z) output from the second stage 220.

For example, the amplifier 201 may include a first input terminal of receiving the residual signal Vres1(z) from the first stage 210 and a second input terminal of receiving the residual signal Vres2(z) from the second stage 220 through the block 206. As the residual signal Vres2(z) passes through the block 206, the residual signal Vres2(z) output from the second stage 220 may be delayed twice (e.g., as much as two sampling periods) and may be input to the amplifier 201 ("$z^{-2}$"). The residual signal Vres2(z) may be one of the residual signals (Vres2,a) and (Vres2,b). The delayed residual signal Vres2(z) may be amplified by the amplifier 201c as much as "1/G" times. As such, a magnitude of the delayed residual signal Vres2(z) may be decreased.

The amplifier 201c may correspond to the amplifier 202 of FIG. 2. For example, the residual signal (Vres2,a) generated by the channel 221 of the second stage 220 may be delayed as much as two sampling periods (e.g., may pass through the block 206) and may then be amplified by the amplifier 201c as much as "1/G" times. Unlike the embodiment illustrated in FIG. 4, like the amplifier 202 of FIG. 2, the amplifier 201c may not include the inter-stage amplifier 201.

The subtracter 201a of the amplifier 201 may calculate a difference between the residual signal Vres1(z) output from the first stage 210 and an output signal of the amplifier 201c. The amplifier 201b may amplify a calculation result of the subtracter 201a. For example, the amplifier 201b may amplify the calculation result of the subtracter 201a as much as "G" times. The amplifier 201b may transfer the amplified signal to the comparator 203.

In some embodiments, the amplifier 201 may be implemented as an operational transconductance amplifier (OTA). Through the amplifier 201, a resonator of a high Q-factor may be implemented in the ADC 200 having a pipelined structure. In other words, as only one OTA (e.g., the amplifier 201) is included in the ADC 200, it may be possible to implement a resonator having a high Q-factor in the bandpass ADC 200. As such, the area of the ADC 200 may decrease, the level of difficulty of implementation of the ADC 200 may decrease, and power efficiency of the ADC 200 may be improved.

The comparator 203 may include adders 203a and 203b, an amplifier 203c, and a subtracter 203d. The comparator 203 may include two input terminals ("2-Input CMP"). For example, the comparator 203 may include a first input terminal of receiving an amplified signal from the amplifier 201b in the amplifier 201 and a second input terminal of receiving the twice delayed residual signal Vres2(z) from the block 206.

In some embodiments, the comparator 203 may be included in the second stage 220. For example, each of the channels 221 and 222 of the second stage 220 may include the comparator 203. For another example, the channels 221 and 222 of the second stage 220 may sequentially (or alternately) share the comparator 203.

The residual signal Vres2(z) twice delayed through the block 206 may be attenuated at a given ratio and may be applied to a digital signal D2(z) generated by analog-to-digital conversion of the second stage 220 (or generated by the second stage 220). For example, the residual signal Vres2(z) twice delayed through the block 206 may be transferred to the adder 203a after being amplified as much as "¾" times. The adder 203a may calculate a sum of an output signal of the amplifier 203c and an output signal of the amplifier 201b. The adder 203b may calculate a sum of a calculation result of the adder 203a and a quantization noise Q2(z) generated by the second stage 220. The quantization noise Q2(z) may be generated from analog-to-digital conversion that is performed in the second stage 220. A calculation result of the adder 203b may be transferred to the amplifier 204 as the digital signal D2(z). The digital signal D2(z) may be a result of analog-to-digital conversion that is performed in the second stage 220.

The digital signal D2(z) may be one of the digital signals (D2,a) and (D2,b). For example, when analog-to-digital conversion is performed by the channel 221, the adder 203b may calculate a sum of a calculation result of the adder 201a and a quantization noise generated by the channel 221 and may output the calculated sum as the digital signal (D2,a).

The calculation result of the adder 203b may also be transferred to the subtracter 203d. The subtracter 203d may calculate a difference between a signal output from the amplifier 201 and the calculation result of the adder 203b. The adder 203d may transfer a calculation result to the block 206 as the residual signal Vres2(z) of the second stage 220.

The amplifier 204 may amplify the digital signal D2(z) as much as "1/G" times. The amplifier 204 may transmit the amplified signal to the adder 205. The adder 205 may calculate a sum of the digital signal D1(z) generated from the first stage 210 and the "1/G" times-amplified digital signal D2(z) generated from the second stage 220. A calculation result of the adder 205 may be output as a digital signal Dout(z). The output digital signal Dout(z) may be a result of analog-digital conversion that the ADC 200 performs on the input signal Vin(z).

Figure 5:
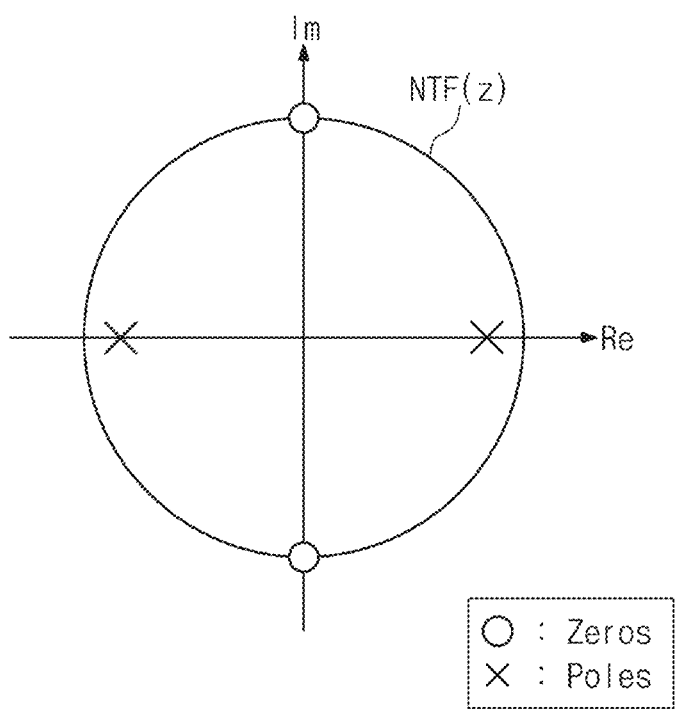
FIG. 5 illustrates a noise transfer function corresponding to an ADC according to some embodiments of the present disclosure.

FIG. 5 illustrates a noise transfer function NTF(z) corresponding to the ADC 200 according to some embodiments of the present disclosure. Referring to FIGS. 1 to 5, the noise transfer function NTF(z) may have two poles and two zeros.

In the embodiment illustrated in FIG. 4, the residual signal Vres2(z) of the second stage 220 may again be input to the amplifier 201 through the block 206. As an error of analog-to-digital conversion is fed back, the ADC 200 may be implemented as a noise shaping ADC of an error-feedback structure. A noise transfer function $NTF_{EF}(z)$ by the error feedback may satisfy Equation 2 below.

$$NTF_{EF}(z)=1+z^{-2} \quad \text{[Equation 2]}$$

Referring to Equation 2 above, the noise transfer function $NTF_{EF}(Z)$ may have two zeros. As such, the intermediate frequency IF of the ADC 200 may satisfy Equation 1 (i.e., the intermediate frequency IF may be ¼ times the sampling rate Fs).

In the embodiment illustrated in FIG. 4, the residual signal Vres2(z) of the second stage 220 may be delayed twice by the block 206, may then be amplified by the amplifier 203c as much as "¾" times, and may again be input to the adder 203a. As such, the residual signal Vres2(z) may again be input to the comparator 203 through a feed-forward path. A noise transfer function $NTF_{FF}(Z)$ by the feed-forward may satisfy Equation 3 below.

$$NTF_{FF}=1/(1-0.75z^{-2}) \quad \text{[Equation 3]}$$

Referring to Equation 3 above, the noise transfer function $NTF_{FF}(Z)$ may have two poles. As such, a quantization noise in the in-band of the ADC 200 may effectively decrease.

Referring to Equation 2 and Equation 3 above, the noise transfer function NTF(z) of the ADC 200 may satisfy Equation 4 below.

$$NTF(z)=(1+z^{-2})/(1-0.75z^{-2}) \quad \text{[Equation 4]}$$

Referring to Equation 4 above, the intermediate frequency IF of the ADC 200 may be ¼ times the sampling rate Fs, and a quantization noise in the in-band of the ADC 200 may effectively decrease. As such, the ADC 200 may be implemented as a bandpass ADC, and the performance of the ADC 200 may be improved.

Figure 6A:
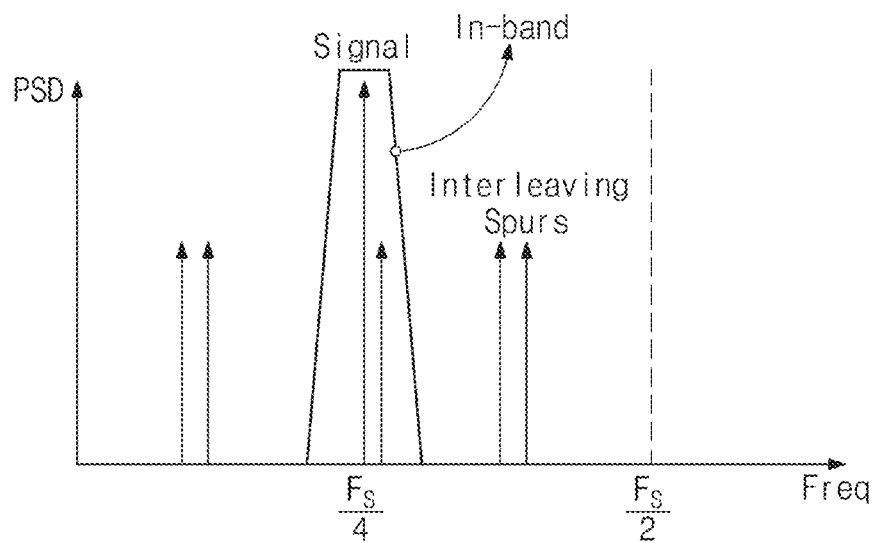
FIGS. 6A and 6B illustrate interleaving spurs caused by mismatch between channels of a time interleaving bandpass ADC, according to some embodiments of the present disclosure.
Figure 6B:
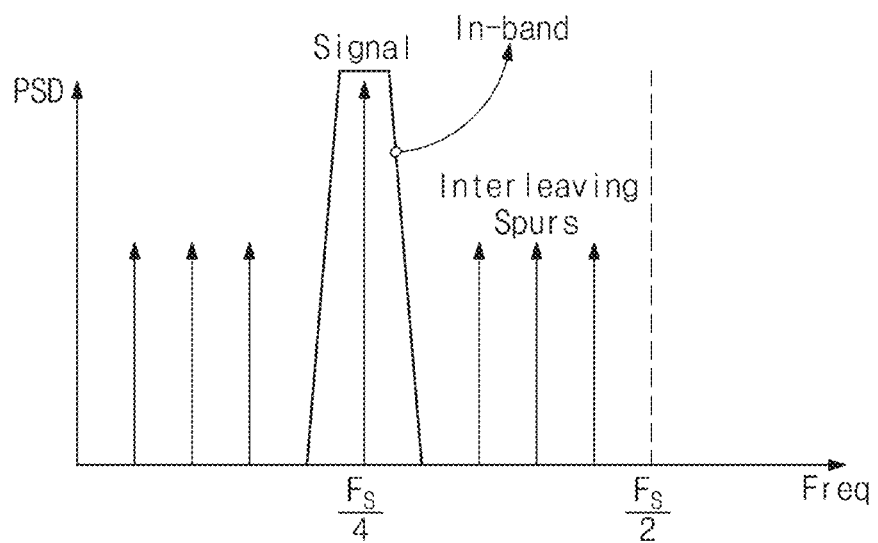

FIGS. 6A and 6B illustrate interleaving spurs caused by mismatch between channels of a time interleaving bandpass ADC, according to some embodiments of the present disclosure. In more detail, in a time interleaving bandpass ADC in which the intermediate frequency IF is ¼ times the sampling rate Fs, FIG. 6A shows an input signal "Signal" of a time interleaving bandpass ADC including an even number of channels and a power spectrum density PSD of interleaving spurs. FIG. 6B shows an input signal "Signal" of a bandpass ADC including an odd number of channels and a power spectrum density PSD of interleaving spurs.

Performance of a plurality of channels included in one time interleaving ADC may not be completely equal. In this case, interleaving spurs may occur due to the mismatch between channels. For example, interleaving spurs may occur due to offset mismatch coming from an offset difference of channels, gain mismatch coming from a gain difference, timing mismatch coming from a time skew, and bandwidth mismatch coming from a bandwidth difference of channels. The resolution of the time interleaving ADC may be degraded due to the interleaving spurs.

Referring to FIG. 6A, interleaving spurs of the time interleaving bandpass ADC including an even number of channels may be present in the in-band. This may cause the degradation of resolution of the time interleaving bandpass ADC. In contrast, referring to FIG. 6B, interleaving spurs of the time interleaving bandpass ADC including an odd number of channels may be out of the in-band. For example, in an ADC having a narrow bandwidth around the intermediate frequency IF, interleaving spurs may not be formed in the in-band.

In some embodiments, the ADC 200 may include a first stage including an odd number of channels and a second stage including an even number of channels. For example, in the embodiment illustrated in FIG. 2, the first stage 210 may include three channels 211, 212, and 213. Accordingly, without separate complicated calibration, the interleaving spurs of the first stage 210 may not be formed in the in-band. As a result, the time interleaving bandpass ADC 200, the accuracy of which is improved while having a fast sampling rate and a simple structure may be proved.

Because the second stage 220 includes the channels 221 and 222, interleaving spurs may occur in the in-band. However, because quantization of the second stage 220 is performed based on a residual signal (Vres1,a)/(Vres1,b)/(Vres1,c) remaining after analog-to-digital conversion is performed on an upper bit in the first stage 210, magnitudes of interleaving spurs of the second stage 220 may be relatively very small. Accordingly, the interleaving spurs of the second stage 220 may not affect the resolution of the ADC 200.

Figure 7A:
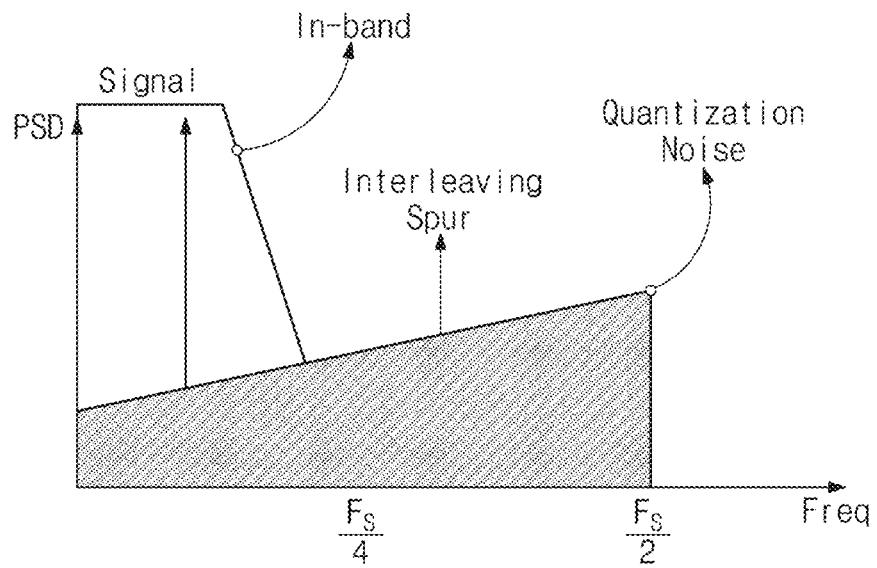
FIGS. 7A and 7B illustrate an interleaving spur and a quantization noise occurring in an in-band of a time interleaving noise shaping ADC, according to some embodiments of the present disclosure.
Figure 7B:
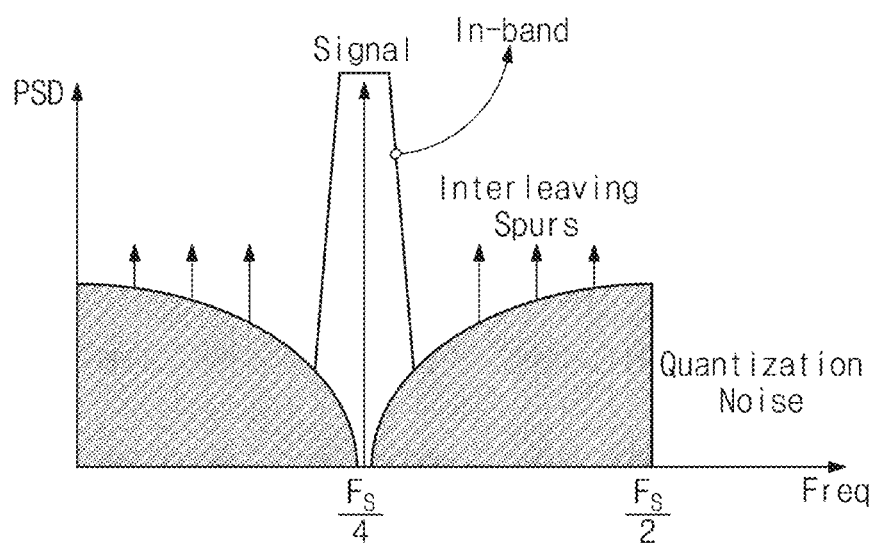

FIGS. 7A and 7B illustrate an interleaving spur and a quantization noise occurring in an in-band of a time interleaving noise shaping ADC, according to some embodiments of the present disclosure. In more detail, FIG. 7A shows an input signal "Signal" of a time interleaving low pass noise shaping ADC, interleaving spurs, and a power spectrum density PSD of a quantization noise. FIG. 7B shows an input signal of the time interleaving bandpass noise shaping ADC 200, interleaving spurs, and a power spectrum density PSD of a quantization noise.

In the embodiment illustrated in FIG. 7A, an in-band of an ADC may be in a relatively low frequency band. A quantization noise of the ADC may be small in a low frequency band and may increase as a frequency increases. The intermediate frequency IF may be lower than that at a point where the intermediate frequency IF is ¼ times the sampling rate Fs. Interleaving spurs occurring from the ADC of FIG. 7A may be around an intermediate frequency band. In this case, it may be difficult to implement a bandpass characteristic in which the intermediate frequency IF satisfies ¼ times the sampling rate Fs.

In contrast, in the embodiment illustrated in FIG. 7B, interleaving spurs may not exist in the in-band of the ADC 200. Nose shaping may be performed on a quantization noise in the in-band, and thus, the quantization noise in the in-band may decrease. The ADC 200 may have a band pass characteristic.

Figure 8:
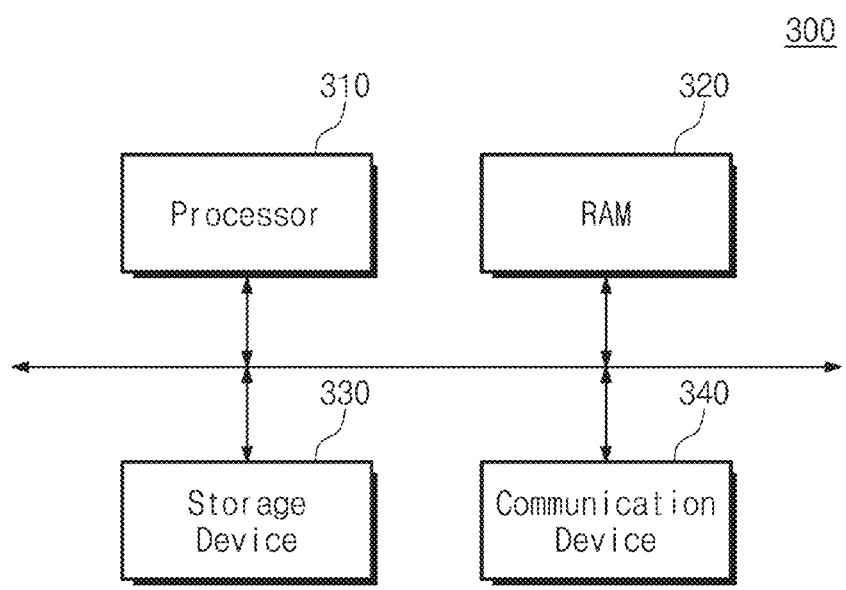
FIG. 8 is a block diagram of an electronic device according to some embodiments of the present disclosure.

FIG. 8 illustrates a block diagram of an electronic device 300 according to some embodiments of the present disclosure. Referring to FIG. 8, the electronic device 300 may include a processor 310, a memory 320, a storage device 330, and a communication device 340. In some embodiments, the electronic device 300 may include a mobile device such as a smartphone or a tablet PC.

The processor 310 may function as a central processing unit of the electronic device 300. For example, the processor 310 may control an operation of the electronic device 300 by executing software, firmware, program codes, or instructions loaded onto the memory 320.

The memory 320 may store data and program codes that are processed by the processor 310 or are scheduled to be processed by the processor 310. For example, the memory 320 may store data and program codes provided from the user or an external device. The software, firmware, program codes, or instructions for controlling the electronic device 300 may be loaded onto the memory 320 under control of the processor 310. Data stored in the storage device 330 may be loaded onto the memory 320 under control of the processor 310. The memory 320 may be a main memory device of the electronic device 300. The memory 320 may include a dynamic random access memory (DRAM) or a static random access memory (SRAM).

The storage device 330 may store data generated by the processor 310 for the purpose of long storage, a file to be driven by the processor 310, or various codes executable by the processor 310. The storage device 330 may function as an auxiliary memory device of the electronic device 300. The storage device 330 may include a flash memory or etc. Unlike the embodiment illustrated in FIG. 8, the storage device 330 may be implemented as an external device of the electronic device 300.

The communication device 340 may communicate with an external device of the electronic device 300. For example, under control of the processor 310, the communication device 340 may transmit data to an external device or may receive data from the external device, based on various wired or wireless protocols.

In some embodiments, the communication device 340 may include a receiver including the ADC 200 for the purpose of receiving a radio frequency (RF) signal from the outside. For example, the receiver may be used in $5^{th}$ generation (5G) or $6^{th}$ generation (6G) communication. In the above embodiment, the ADC 200 may operate at low power while having high resolution and may occupy the small area in the receiver. The ADC 200 may be implemented as a time interleaving pipelined noise shaping SAR ADC including an odd number of channels, and thus, the ADC 200 may maintain high resolution while operating at high speed.

Also, in the above embodiment, the ADC 200 may have a bandpass characteristic. As such, the waste of resources may be prevented by performing only digital conversion of a desired bandwidth, and the use of the ADC 200 may not be limited to a low frequency band. For example, compared to a receiver including a low pass ADC, the receiver including the ADC 200 may process signals in a relatively high frequency band.

Figure 9:
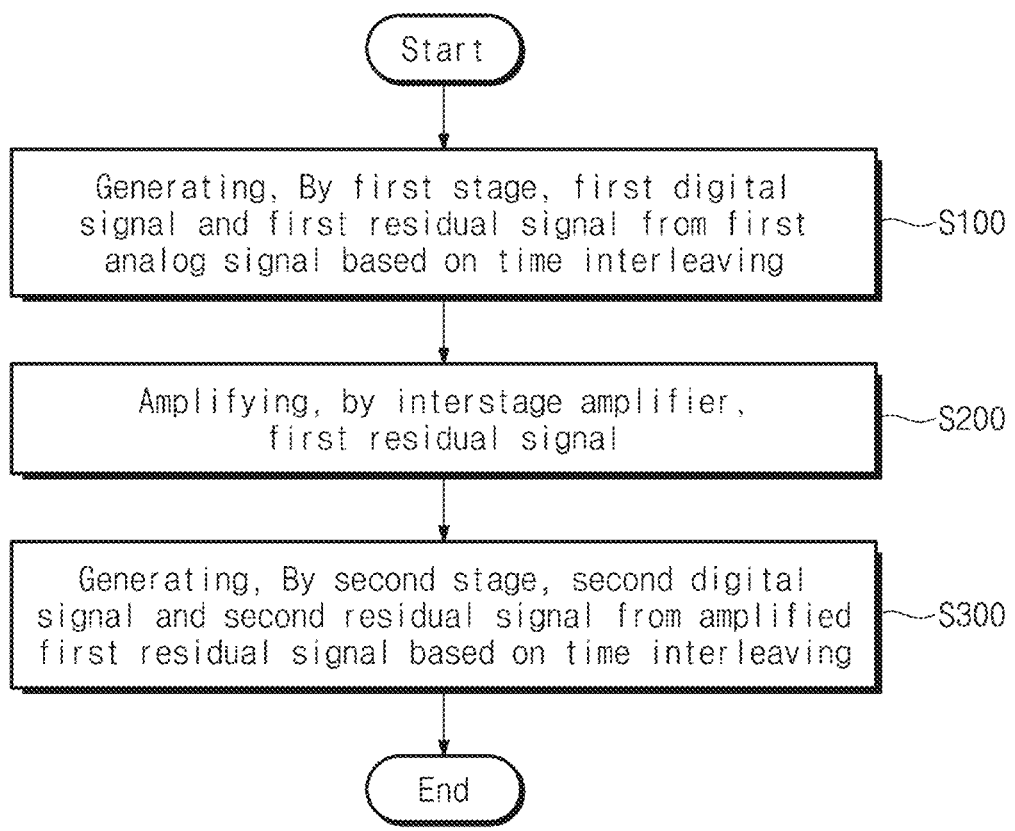
FIG. 9 is a flowchart illustrating an operating method of an ADC according to some embodiments of the present disclosure.

FIG. 9 is a flowchart illustrating an operating method of the ADC 200 according to some embodiments of the present disclosure. Referring to FIGS. 2 and 9, the ADC 200 may perform operation S100 to operation S300.

In operation S100, the first stage 210 of the ADC 200 may generate a first digital signal and a first residual signal from a first analog signal based on time interleaving. For example, the channels 211 to 213 of the first stage 210 may generate a first sampling signal by sequentially sampling the first analog signal based on the time interleaving. The channels 211 to 213 may generate the first digital signal and the first residual signal corresponding to the first analog signal by sequentially performing analog-to-digital conversion based on the first sampling signal. For example, the first digital signal may correspond to the most significant bit (MSB) corresponding to the first analog signal. The first residual signal may correspond to a difference between the first analog signal and the first digital signal.

In operation S200, the inter-stage amplifier 201 of the ADC 200 may amplify the first residual signal. For example, the inter-stage amplifier 201 may receive the first residual signal and a second residual signal generated by the second stage 220 in response to a second analog signal input before two periods on a basis of the first analog signal. The inter-stage amplifier 201 may amplify the first residual signal, based on a second residual signal generated by the second stage 220 in response to the second analog signal. The inter-stage amplifier 201 may transfer the amplified first residual signal to the second stage 220.

In operation S300, the second stage 220 of the ADC 200 may generate a second digital signal and the second residual signal from the amplified first residual signal based on the time interleaving. For example, the channels 221 and 222 of the second stage 220 may generate a second sampling signal by sequentially sampling the amplified first residual signal based on the time interleaving. The channels 221 and 222 may generate the second digital signal and the second residual signal corresponding to the first analog signal by sequentially performing analog-to-digital conversion based on the second sampling signal. For example, the second digital signal may correspond to the least significant bit (LSB) corresponding to the first analog signal. The second residual signal may correspond to a difference between the amplified first residual signal and the second digital signal.

According to some embodiments of the present disclosure, a time interleaving-based bandpass noise shaping SAR analog-to-digital converter of a pipelined structure capable of implementing a resonator, which is simple and has a high Q-factor, through one operational transconductance amplifier (OTA) may be provided. As such, power consumption of the analog-to-digital converter may decrease. The analog-to-digital converter may include both a time interleaving structure and a pipelined structure, and thus, the analog-to-digital converter may provide high resolution while operating at high speed and may cope with a wide bandwidth. Also, the burden of design for a quantizer of the analog-to-digital converter may decrease.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An analog-to-digital converter comprising:
   a first stage including a plurality of channels, and the first stage which generates a first sampling signal by sequentially sampling a first analog signal based on time interleaving and generates a first digital signal and a first residual signal corresponding to the first analog signal by performing analog-to-digital conversion based on the first sampling signal;
   an amplifier which amplifies the first residual signal; and
   a second stage including a plurality of channels, to the second stage which generates a second sampling signal by sequentially sampling the amplified first residual signal based on time interleaving and generates a second digital signal and a second residual signal corresponding to the first analog signal by performing analog-to-digital conversion based on the second sampling signal,
   wherein the number of the plurality of channels included in the first stage is odd-numbered.

2. The analog-to-digital converter of claim 1, wherein the number of the plurality of channels included in the second stage is even-numbered.

3. The analog-to-digital converter of claim 1, wherein each of the plurality of channels of the first stage and the plurality of channels of the second stage includes a successive approximation register (SAR) analog-to-digital converter (ADC).

4. The analog-to-digital converter of claim 1, wherein the amplifier is shared by the plurality of channels of the first stage and alternately amplifies the first residual signal, which is sequentially generated from each of the plurality of channels, based on a first period.

5. The analog-to-digital converter of claim 4, wherein the amplifier receives the first residual signal and a second residual signal, which is generated by the second stage in response to a second analog signal input before two periods on a basis of the first analog signal.

6. The analog-to-digital converter of claim 5, wherein the analog-to-digital converter has a bandpass characteristic, based on the second residual signal generated by the second stage in response to the second analog signal.

7. The analog-to-digital converter of claim 5, wherein the second residual signal generated by the second stage in response to the second analog signal is attenuated at a first ratio, and
wherein the second stage performs the analog-to-digital conversion further based on the attenuated second residual signal.

8. The analog-to-digital converter of claim 5, wherein the plurality of channels of the first stage include a first channel, a second channel, and a third channel, and
wherein, while sampling of the first analog signal is performed through the first channel in an n-th period, amplification of a sampling signal corresponding to an (n−2)-th period is performed through the second channel, and the analog-to-digital conversion of a sampling signal corresponding to an (n−1)-th period is performed through the third channel.

9. The analog-to-digital converter of claim 5, wherein the plurality of channels of the second stage include a first channel and a second channel, and
wherein, while sampling of the first residual signal is performed through the first channel in an n-th period, the analog-to-digital conversion of a sampling signal corresponding to an (n−1)-th period is performed through the second channel.

10. The analog-to-digital converter of claim 1, wherein each of the plurality of channels of the first stage transfers the first residual signal corresponding to the first sampling signal to the second stage.

11. An electronic device comprising:
a processor; and
a communication device including an analog-to-digital converter, to the communication device which communicates with an external device under control of the processor,
wherein the analog-to-digital converter includes:
a first stage including a plurality of channels, to the first stage which generates a first sampling signal by sequentially sampling a first analog signal based on time interleaving and generates a first digital signal and a first residual signal corresponding to the first analog signal by performing analog-to-digital conversion based on the first sampling signal;
an amplifier which amplifies the first residual signal; and
a second stage including a plurality of channels, the second stage which generates a second sampling signal by sequentially sampling the amplified first residual signal based on time interleaving and generates a second digital signal and a second residual signal corresponding to the first analog signal by performing analog-to-digital conversion based on the second sampling signal,
wherein the number of the plurality of channels of the first stage is odd-numbered, and the number of the plurality of channels of the second stage is even-numbered.

12. The electronic device of claim 11, wherein each of the plurality of channels of the first stage and the plurality of channels of the second stage includes a successive approximation register (SAR) analog-to-digital converter (ADC).

13. The electronic device of claim 11, wherein the amplifier is shared by the plurality of channels of the first stage and alternately amplifies the first residual signal, which is sequentially generated from each of the plurality of channels, based on a first period.

14. The electronic device of claim 13, wherein the amplifier receives the first residual signal and a second residual signal, which is generated by the second stage in response to a second analog signal input before two periods on a basis of the first analog signal.

15. The electronic device of claim 14, wherein the analog-to-digital converter has a bandpass characteristic, based on the second residual signal generated by the second stage in response to the second analog signal.

16. The electronic device of claim 14, wherein the second residual signal generated by the second stage in response to the second analog signal is attenuated at a first ratio, and
wherein the second stage performs the analog-to-digital conversion further based on the attenuated second residual signal.

17. An operating method of an analog-to-digital converter which includes a first stage and a second stage each including a plurality of channels, and an inter-stage amplifier, the method comprising:
generating, by the first stage, a first sampling signal by sequentially sampling a first analog signal based on time interleaving;
generating, by the first stage, a first digital signal and a first residual signal corresponding to the first analog signal by sequentially performing analog-to-digital conversion based on the first sampling signal;
amplifying, by the inter-stage amplifier, the first residual signal;
generating, by the second stage, a second sampling signal by sequentially sampling the amplified first residual signal based on time interleaving; and
generating, by the second stage, a second digital signal and a second residual signal corresponding to the first analog signal by performing analog-to-digital conversion based on the second sampling signal,
wherein the number of the plurality of channels of the first stage is odd-numbered, and the number of the plurality of channels of the second stage is even-numbered.

18. The method of claim 17, wherein each of the plurality of channels of the first stage and the plurality of channels of the second stage includes a successive approximation register (SAR) analog-to-digital converter (ADC).

19. The method of claim 17, wherein the amplifying of the first residual signal includes:
receiving the first residual signal and the second residual signal, which is generated by the second stage in response to a second analog signal input before two periods on a basis of the first analog signal.

20. The method of claim 19, wherein the analog-to-digital converter has a bandpass characteristic, based on the second residual signal generated by the second stage in response to the second analog signal.

\* \* \* \* \*